United States Patent [19]

Nakata

[11] 3,920,955

[45] Nov. 18, 1975

[54] ELECTRONIC THERMALLY SENSITIVE SWITCH DEVICE

[75] Inventor: Josuke Nakata, Itami, Japan

[73] Assignee: Mitsubishi Denki Kabushiki Kaisha, Tokyo, Japan

[22] Filed: Sept. 16, 1974

[21] Appl. No.: 506,052

[30] Foreign Application Priority Data

| | | |
|---|---|---|
| Sept. 20, 1973 | Japan | 48-106272 |
| Sept. 26, 1973 | Japan | 48-108113 |
| Sept. 26, 1973 | Japan | 48-108117 |
| Nov. 15, 1973 | Japan | 48-128848 |

[52] U.S. Cl. ................ 219/501; 219/490; 219/494; 307/252 B

[51] Int. Cl.$^2$ ............................................ H05B 1/02

[58] Field of Search ............ 307/310, 252 A, 252 B, 307/252 N, 252 T; 219/490, 494, 497, 499, 501; 317/148.5 A

[56] References Cited

UNITED STATES PATENTS

| | | | |
|---|---|---|---|
| 3,166,680 | 1/1965 | Kevane et al. | 317/148.5 A |
| 3,603,817 | 9/1971 | Cosson | 307/252 A |
| 3,729,651 | 4/1973 | Fricker et al. | 307/252 B |
| 3,746,887 | 7/1973 | Lorenz | 307/252 B |
| 3,775,591 | 12/1972 | Gould | 307/252 B |

*Primary Examiner*—J. D. Miller
*Assistant Examiner*—Fred E. Bell
*Attorney, Agent, or Firm*—Wenderoth, Lind & Ponack

[57] ABSTRACT

Two thermally sensitive thyristors are connected in reverse parallel between a gate electrode of a triac and the junction of two resistors serially connected across both main electrodes of the traic. The thyristors are externally heated to control a load through the triac. Alternatively, such thyristors may be serially connected to a resistor across the main electrodes of the triac while two diodes are connected in reverse parallel between its gate electrode and the junction of the resistor and thyristors. In either event, the parallel thyristors may be replaced by a full-wave rectifier bridge having a thermally sensitive thyristor connected across dc outputs of the bridge.

10 Claims, 6 Drawing Figures

ELECTRONIC THERMALLY SENSITIVE SWITCH DEVICE

BACKGROUND OF THE INVENTION

This invention relates to an electronic thermally sensitive switch device.

In order to control the load current in accordance with a change in temperature, there have been recently proposed many types of thermally responsive switch devices employing semiconductor elements, for example, bidirectional triode thyristors as switches. The ON-OFF control or phase control of such thyristors has required the additional use of a thermally sensitive element serving as a temperature sensor. Heretofore the thermistor has been frequently used to form a thermally sensitive switch circuit with a resistance bridge a transistor or a thyristor to control the gate triggering current flowing through the bidirectional triode thyristor. The conventional type of thermally sensitive switch devices including the thermistors has not always been satisfactory in operation because the thermistor itself has the disadvantages such as a secular change in resistsance, deviations of the characteristics etc.

SUMMARY OF THE INVENTION

Accordingly it is an object of the present invention to provide a new and improved electric thermally sensitive switch device including a bidirectional triode thyristor for performing the ON and OFF operations operatively coupled to at least one thermally sensitive thyristor acting as both a temperature sensor and a switch.

It is another object of the present invention to provide a new and improved the alternating current type of electronic thermally sensitive switch device including a pair of thermally sensitive thyristors interconnected in anti-parallel circuit relationship.

It is still another object of the present invention to provide a new and improved electronic sensitive switch device including a thermally sensitive thyristor thermally coupled to a load controlled by a bidirectional triode thyristor involved to protect the load from overheating.

It is a further object of the present invention to provide a new and improved electronic thermally sensitive switch device for selectively controlling a load through a bidirectional triode thyristor so that the load may be operated in the nonconducting mode in each complete cycle, in the conducting mode in each half cycle or in the conducting mode in each complete cycle of a source voltage.

The present invention accomplishes these objects by the provision of an electronic thermally sensitive switch device comprises a bidirectional triode thyristor including a gate electrode and a main electrode to control a load, at least one thermally sensitive thyristor connected between the gate and main electrodes of the bidirectional triode thyristor, and means for operating the thermally sensitive thyristor in response to heat to control the load through the bidirectional triode thyristor.

Alternatively, the bidirectional triode thyristor may the gate and main electrodes connected across a pair of alternating input terminals of a full-wave rectifier bridge including a pair of direct current output terminals having a thermally sensitive thyristor connected thereacross.

In order to close and open a gate triggering current path for the bidirectional triode thyristor, the thermally sensitive thyristor may be connected between the gate electrode of the bidirectional triode thyristor and a junction of two resistors serially connected across a pair of the main electrodes of the bidirectional triode thyristor.

In order to bypass a gate triggering current, the thermally sensitive thyristor may be connected in series with a resistor across a pair of the main electrodes of the bidirectional triode thyristor.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
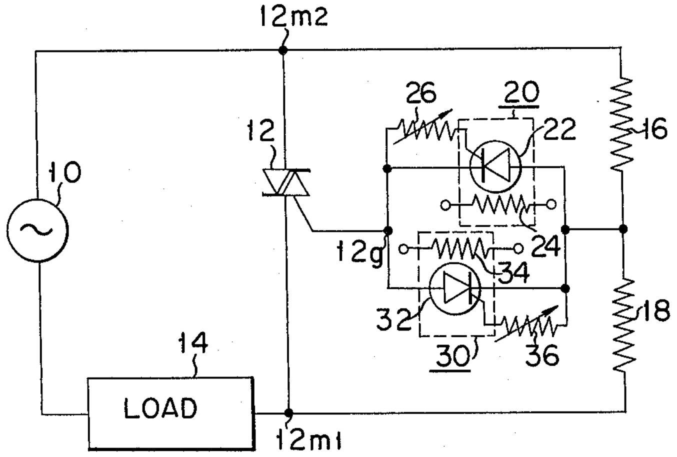
FIG. 1 is a circuit diagram of an electric thermally sensitive switch device constructed in accordance with the principles of the present invention.

Referring now to the drawings and FIG. 1 in particular, it is seen that an arrangement disclosed herein comprises a source 10 of alternating current and a bidirectional triode thyristor 12 serially connected to a resistance load 14 across the source 10. The bidirectional triode thyristor 12 is commerically available under a trade mark "TRIAC" and has a series combination of voltage dividing resistsors 16 and 18 connected across the first and second main electrode terminals $\mathbf{12}_{m1}$ and $\mathbf{12}_{m2}$ thereof respectively. The bidirectional triods thyristor is called hereinafter a "triac."

A pair of indirectly heated, thermally sensitive thyristor devices generally designated by the reference numerals 20 and 30 respectively are interconnected in anti-parallel circuit relationship between a gate electrode terminal 12*g* of the triac 12 and the junction *a* of the resistors 16 and 18. Each of the thermally sensitive thyristor devices 20 or 30 includes a thermally sensitive thyristor 22 or 32 and a heat source shown as being an electrically heated resistor 24 or 34 disposed adjacent the associated thyristor 22 or 32 to be thermally coupled to but electrically and physically isolated from the latter. The thyristor 22 includes a cathode electrode connected to the gate terminal 12*g* of the triac 12, an anode electrode connected to the junction of the resistors 16 and 18 and a gate electrode connected to the cathode electrode through a variable resistor 26. Similarly, the thyristor 32 includes a cathode electrode connected to the junction of the resistor 16 and 18, an anode electrode connected to the gate terminal 12*g* of the traic 12 and a gate electrode connected to the anode electrode through a variable resistor 36.

In the arrangement of FIG. 1, the triac 12 performs the ON-OFF control of the load 14, and the voltage dividing resistors 16 and 18 serially connected across the main terminals $12_{m2}$ and $12_{m1}$ of the triac 12 forms a part of a control circuit for the triac 12. The thermally sensitive thyristor devices 20 and 30 along with the resistor 16 forms a switching circuit for opening and closing a gate triggering current path for the triac 12 through the operation of the heat sources or resistors 24 and 26.

The dividing resistor 18 is preliminarily selected to have a magnitude of resistance sufficiently smaller than that of the dividing resistor 16 in order to lower a voltage applied across each of the thermally sensitive thyristor devices 20 or 30. Also a gate current can flow through the dividing resistor 16 due to a voltage across the gate terminal 12*g* and that main electrode opposite to the gate electrode of the triac 12. Therefore it is necessary to select the magnitude of resistance 16 sufficient to render the peak value of the gate current less than a permissible magnitude for the traic. However if the magnitude or resistance 16 is too high, the triac 12 is not triggered to its conducting state at the beginning of each cycle of the source voltage. Thus the phase control is effected to decrease the resulting load voltage as well as deforming a waveform thereof. Accordingly the resistor 16 must have a magnitude of resistance within certain limits.

Figure 2:
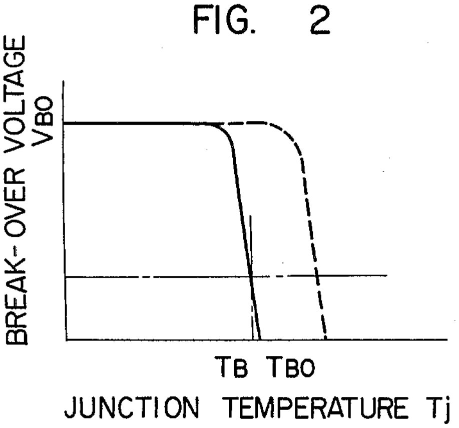
FIG. 2 is a graph illustrating break-over voltage-to-junction temperature characteristic of the thermally sensitive thyristor shown in FIG. 1.

Like conventional thyristor, the thermally sensitive thyristors 22 and 32 are of a PNPN four layer structure and has a forward break-over voltage dependent upon a junction temperature as shown in FIG. 2. In FIG. 2 a break-over voltage $V_{BO}$ is plolled in ordinate against a junction temperature $I_j$. If the break-over voltage $V_{BO}$ of the thermally sensitive thyristor is less than the peak value $V_a$ of a voltage applied across the thyristor due to an increase in temperature thereof then the thyristor is always broken over to be conducting at temperatures above that increased temperature. In FIG. 2 the thyristor as a minimum temperature of $T_B$ at and above which the thermally sensitive thyristor is always broken over to be in its conducting state.

At sufficiently low temperatures thermally sensitive thyristors have the forward voltage-to-current characteristic including a pair of operating states, or a stable ON state and a stable OFF state. However any thermally sensitive thyristor at and above a predetermined temperature lost its OFF state and becomes substantially equal in the forward voltage-to-current characteristic to P-N junction diodes. The predetermined temperature is called herein a "switching temperature."

In order to return the thermally sensitive thyristor back to its OFF state from its ON state, it is required essential to make the junction temperature less than the switching temperature thereof while maintaining the ON-state current equal to or less than the holding current thereof.

Thermally sensitive thyristors have the switching temperature widely adjustable in accordance with the conditions for biasing the gate electrode relative to the cathode electrode thereof, and the resistance connected across both electrodes. For example, the switching temperature is maximum with the gate electrode biased reversely with respect to the cathode electrode and is decreased as the parallel resistance increased in magnitude.

In FIG. 1, each of the variable resistors 26 or 36 can be adjusted to control the switching temperature at and above which the associated thermally sensitive thyristor 22 or 32 is broken over to be conducting. In FIG. 2 dotted curve describes the relationship between the break-over voltage and the junction temperature obtained with the variable resistor 26 or 36 less in a magnitude of resistance than that providing the break-over voltage-to-junction temperature characteristic as shown at solid curve in FIG. 2.

The mode of operation of the arrangement as shown in FIG. 1 will now be described with reference to FIG. 3 wherein there are illustrated waveforms of the load current resulting from the ON-OFF operation of the thermally sensitive thyristor devices 20 and 30.

Figure 3:
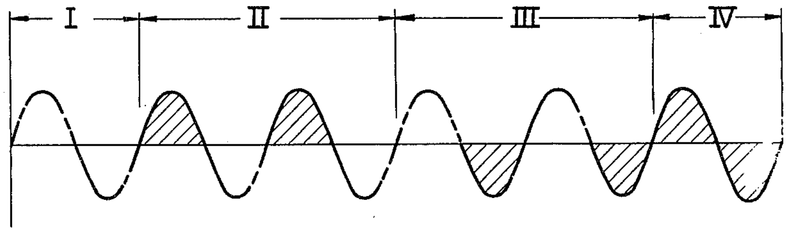
FIG. 3 is a graph useful in explaining the operation of the arrangement shown in FIG. 1.

1 During a time period labelled I in FIG. 3, the heat sources 24 and 34 for both thermally sensitive thyristors 22 and 32 have no current supplied thereto. Under these circumstances, if each of the thyristor 22 or 32 has the break-over voltages higher than the peak value of a voltage applied thereacross then a gate triggering current supplied to the triac 12 is interrupted by the thermally sensitive thyristors 22 and 32 resulting in a null current flowing through the load.

2 During a time period labelled II in FIG. 3, a current flows only through the heat source 24 for the thermally sensitive thyristor 22. Under these circumstance, if the thyristor 22 is raised in temperature until the break-over voltage is null, that is, if the thyristor has a temperature of $T_{BO}$ (see FIG. 2) then the thyristor is broken over at a temperature of $T_B$. When the temperature of $T_{BO}$ (see FIG. 2) is reached, the load has flowing therethrough a positive load current having a substantially complete half cycle waveform as shown by the hatched portions in FIG. 3, the time period II.

3 During a time period labelled III in FIG. 3, a current flows only through the heat source 34 for the thermally sensitive thyristor 32 until the thermally sensitive thyristor 32 is broken over. Under these circumstances, the thermally sensitive thyristor 32 is now conducting as above described in conjunction with the time period II. This causes a flow of current through the load in each of negative half cycles of the source voltage as shown by the hatched portions in FIG. 3, the time period III. 4 During a time period labelled IV in FIG. 3, a current flows through both heat source 24 and 34 for the thermally sensitive thyristors 22 and 32 until both thyristors are conducting. In that event, a load current flows through the load 14 in each of the complete cycles of the source voltage as shown by the hatched portions in FIG. 3, the time period IV.

From the foregoing it will readily be understood that a current can selectively flow through the heat sources (1) to flow a null load current through the load, (2) to flow a load current through the load in each half cycle positive or negative alone or (3) to flow a load current through the load in each of the complete cycles of the source voltage as desired.

Further the heat sources 24 and 34 are electrically insulated from the associated thermally sensitive thyristors 22 and 24 respectively, resulting in an advantage that the load circuit can be electrically isolated from the associated signal source.

With the thermally sensitive thyristor devices 20 and 30 used in the gate triggering circuit as shown in FIG. 1, a relatively low gate current is required only to flow through the thyristors for a short interval of time. Therefore a temperature rise due to the self-heating of the thyristor can be substantially disregarded.

As in conventional thyristors, a semiconductor pellet involved is small-sized. Therefore by disposing an electrically heated heat source in the proximity of the surface of the pellet, a low electric power can be utilized to rapidly heat the pellet resulting in an advantage that a response speed to a signal is high.

While the heat sources 24 and 34 are disposed in the proximity of the thermally sensitive thyristors 22 and 32 and supplied with currents it is to be understood that those thyristors may be disposed on those portions or at positions where temperatures are to be sensed, to respond to a temperature thereon or thereat in excess of a predetermined magnitude to trigger the associated triac to its conducting state thereby to supply an electric power to a load involved.

FIG. 1 shows the simplest circuit for flowing a gate triggering current through the triac via the dividing resistor 16 but it is possible to form a different circuit for supplying a gate triggering current to the triac. In the latter event, a thermally sensitive thyristor capable of being turned on and off dependent upon a temperature may be connected in a gate triggering current path.

Figure 4:
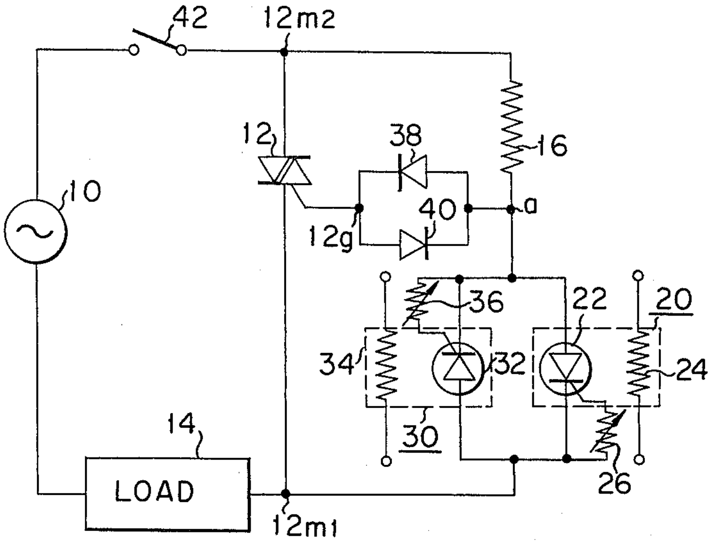
FIG. 4 is a circuit diagram of a modification of the present invention.

Referring now to FIG. 4 wherein like reference numerals designate the components identical or similar to those shown in FIG. 1, there is illustrated a modification of the present invention. The arrangement illustrated is different from that shown in FIG. 1 in that the anti-parallel combination of thermally sensitive thyristor devices 20 and 30 has one end connected to the first main electrode terminal $12_{m1}$ but not to the gate electrode terminal $12g$ of the triac 12 with the dividing resistor 18 omitted and a pair of semiconductor diodes 38 and 40 interconnected in antiparallel circuit relationship are connected between the gate terminal $12g$ and the junction $a$ of the resistor 16 and the reverse parallel combination of the thyristor devices 20 and 30 to form a gate triggering circuit for the triac 12 with the resistor 16. A normally open switch 42 is connected between the source 10 and the triac 12.

With the switch 42 brought into its closed position, an alternating current from the source 10 flows into the gate electrode of the triac 12 through the resistor 16 and either one of the diodes 38 and 42. It is assumed that the gate triggering circuit including the diodes 38 and 40 and the resistor 16 has a low impedance sufficient to trigger the thyristor 12 to its conducting state adjacent that phase angle of the source voltage at which the voltage passes through its zero point (or adjacent a null voltage) thereby to latch triac 10 its conducting state at the beginning of each half cycle thereof. Under the assumed condition, an electric power of the alternating current waveform continues to be supplied to the load 14 as long as the thermally sensitive thyristors 22 and 32 are in their OFF state.

Then by heating the thermally sensitive thyristor 22 by the associated heat source 24, the thyristor 22 will reach a switching temperature as above defined to be triggered it to its ON state. Then in each half cycle of the source voltage in which the second main electrode $12_{m2}$ is positive with respect to the first main electrode $12_{m1}$ of the triac 12, the now conducting thyristor 22 bypasses the gate triggering current therethrough to interrupt the gate current.

The diodes 38 and 40 have been connected in the gate circuit of the triac 12 because, with the thermally sensitive thyristors 22 and 32 put in their ON state, an ON-state voltage across either of the diodes 38 or 40 is applied to the gate electrode thereof so as to prevent that ON-state voltage from exceeding the gate triggering voltage.

As a result, the triac 12 permits only the negative half-wave current to flow through the load within one half cycle after the thermally sensitive thyristor 22 has been brought into its ON state.

Further by heating the thermally sensitive thyristor 32 by the associated heat source 34 to raise it to a switching temperature, the thyristor 32 also loses its OFF state to switch to its ON state. As a result, a gate triggering current to the triac 12 is bypassed by the thermally sensitive thyristor 32 in each half cycle in which the second main electrode $12_{m2}$ is negative with respect to the first main electrode $12_{m1}$ of the triac 12. Thus within one half cycle of the source voltage after this, the triac 12 enters its OFF state to interrupt the load current within one half cycle after the thyristor 32 has been turned on.

On the contrary, a decrease in temperature of the heat source 24 can cause the associated thermally sensitive thyristor 22 to reach a temperature below the switching temperature thereof. At this time, the thyristor 22 restores its forward OFF state within one half cycle of the source voltage due to the inversion of the source voltage. A gate trigger current immediately flows into the triac 12 to permit a current to be supplied to the load only in each of positive half cycles of the source voltage.

Similarly, a decrease in temperature of the heat source 34 causes the thermally sensitive thyristor 32 to be restored to its OFF state with the result that a current with the alternating current waveform is supplied to the load.

As in the arrangement of FIG. 1, the variable resistors 26 and 36 serve to adjust the switching temperature of the mating thermally sensitive thyristors 22 and 32 respectively.

The heat source 26 and 36 may be replaced by heat generated by the load itself or feedback type electric heaters similar in thermal characteristics to that heat. Alternatively the load may be controlled by any suitable heat source disposed separately from the load.

With the load thermally coupled to the thermally sensitive thyristors, the operation as above described is performed at a time point when the thyristors reach their predetermined switching temperature whereby a load current is interrupted to decrease the temperature of load. Thus the load is automatically prevented from overheating.

In the arrangement of FIG. 4, the trigger process is extremely simple while the switching is possible with a null voltage. This results in the advantages that the current waveform is small in distortion and the electromagnetic interference is minimized.

It is to be understood that a triggering current may be applied to the gate electrode of the triac in the manner different from that illustrated. Alternatively, gate trigger systems attended with the phase control may be employed.

In brief, it is required only to switch the gate triggering current to either the gate electrode or the first main electrode of the triac.

Figure 5:
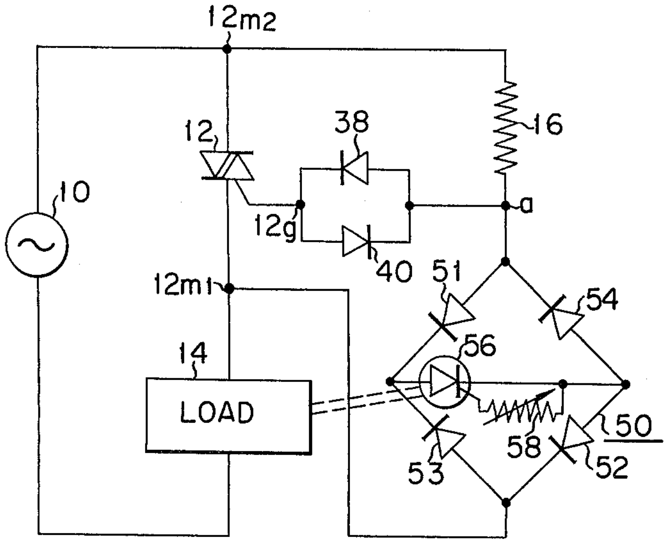
FIG. 5 is a circuit diagram of another modification of the present invention.

In an arrangement shown in FIG. 5, a full-wave rectifier bridge including four semiconductor diode 51, 52, 53 and 54 is connected by a pair of alternating current input terminals to the resistor 16 and the first main terminal $12_{m1}$ of the triac 12 respectively. The bridge also has a thermally sensitive thyristor 56 connected across a pair of direct current output terminals thereof and including a variable resistor 58 connected across the gate and cathode electrode thereof. The thyristor 56 is in thermally close coupling relationship with the load 14 as shown at dotted lines in FIG. 5. The four diodes 51 through 54 and the thermally sensitive thyristor 56 with the variable resistor 58 form a thermally sensitive alternating current switch generally designated by the reference numeral 50. In other respects, the arrangement is identical to that shown in FIG. 4 apart from the switch 42 being omitted only for purposes of illustration, and like reference numerals have been employed to identify the components identical to those shown in FIG. 4. As previously described, the variable resistor 58 serves to adjust the switching temperature of the thermally sensitive thyristor 56. Like the resistor 16 shown in FIGS. 1 and 4, the resistor 16 shown in FIG. 5 is preliminarily selected to have a magnitude of resistance sufficient to restrict the peak value of a current flowing through the thermally sensitive alternating current switch 50 to a magnitude equal to or less than a maximum permissible magnitude therefor as well as permitting the triac 12 to be triggered at a phase angle as near to that for a null source voltage as possible. This is effective for preventing any deformation of the waveform of the load current and for minimizing radio interference.

As in the arrangement of FIG. 4, the diodes 38 and 40 are responsive to the conduction of the thermally sensitive switch 50 to cause a gate triggering current to flow through the triac 12 thereby to double a minimum magnitude of a gate triggering voltage so as to prevent the triac 12 from being triggered. Therefore a voltage drop across either or the parallel diodes 38 and 40 is preferably equal to or greater than that across the thermally sensitive alternating current switch 50. Thus if desired, each diode 38 or 40 may have an additional semiconductor diode or diodes serially connected thereto.

The thermally sensitive thyristor 56 is identical to those shown in FIGS. 1 and 4.

Conventional thyristors are responsive to the gate current or light applied thereto to switch from their OFF to their ON state, whereas thermally sensitive thyristors are operative to change their own characteristic to the characteristic of semiconductor diodes by having their temperature raised. Since the present invention comprises using the thyristor in the manner as above described, the concept of the junction temperature as defined in the field of conventional thyristors does not hold good here.

Like the variable resistors shown in FIGS. 1 and 4, the variable resistor 56 serves to adjust the switching temperature of the thermally sensitive thyristor 56.

The operation of the arrangement as shown in FIG. 5 will now be described. It is assumed that the thermally sensitive thyristor 56 has initially a temperature less than the switching temperature thereof. Under the assumed condition, the thyristor 56 is in its open state. Thus a gate triggering current from the source 10 flows through the triac 12 via the resistor 16 and the anti-parallel combination of the diodes 38 and 40 while it is reversed for each half cycle of the current. Thus the triac 12 is conducting in the opposite directions to cause a flow of full-wave current through the load. In that event the mode of operation in which the gate is triggered is positive in the first quadrant of the voltage-to-current characteristic and negative in the third quadrant thereof, so that the triac can be triggered to its conducting state with a low triggering current.

With that load current high, the same is gradually raised in temperature to increase the temperature of the thermally sensitive thyristor 56 until the latter reaches its predetermined switching temperature to be conducting.

As a result, the thermally sensitive switch 50 is brought into its closed state to bypass the gate triggering current in each of the positive and negative directions therethrough. Accordingly, the triac 12 can not be triggered until the thermally sensitive switch 50 is again opened. Thus the load current is interrupted. As a result of interrupting the load current, the load is lowered in temperature until the temperature of the thermally sensitive thyristor 56 becomes less than the switching temperature thereof. At that time, the thyristor 56 restores the ability to block the current to bring the thermally sensitive switch 50 into its open state. Therefore the triac is triggered to initiate the load current to again flow through the load. Thereafter the process as above described is repeated.

From the foregoing it will be appreciated that, upon the load temperature exceeding a predetermined fixed magnitude, the load current is automatically interrupted while a decrease in the load current under that fixed magnitude causes the load current to flow again through the load. Thus the arrangement of FIG. 5 is effective for preventing the load from overheating or for maintaining the load temperature within a narrow range approximating a predetermined fixed magnitude.

While the triac 12 has been directly triggered from the same source 10 of alternating current as the load a separate trigger source may be used to trigger the triac adjacent a null voltage from the source. Alternatively, the thermally sensitive thyristor 56 may be thermally coupled to a feedback resistor similar in the thermal characteristic to the load but not directly to the load 14. In addition, the thermally sensitive thyristor may be thermally coupled to a different thermal source thermally independent of the load whereby this thermal source is used as a signal source to control an electric power supplied to the load.

Figure 6:
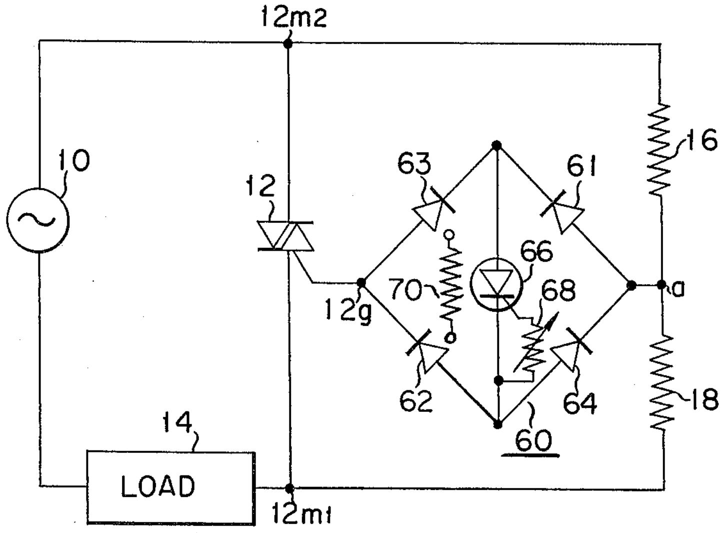
FIG. 6 is a circuit diagram of still another modification of the present invention.

FIG. 6 shows a different modification of the present invention wherein the arrangement of FIG. 1 has a thermally sensitive alternating current switch such as shown by the reference numeral 50 in FIG. 5 substituted for the anti-parallel combination of thermally sensitive thyristor devices 20 and 30 shown in FIG. 1. The thermally sensitive switch generally designated by the reference numeral 60 includes four semiconductor diodes 61, 62, 63 and 64 and a thermally sensitive thyristor 66 with a variable resistor 68 similar to the corresponding components shown in FIG. 5 and interconnected in the same manner as above described in conjunction with FIG. 5. However, the thermally sensitive thyristor 66 is thermally coupled to an external heat source 70 shown as being an electrically heated resistor rather than to the load 14. Alternatively the thyristor 66 may be disposed in an environment where a temperature is to be sensed.

In other respects the arrangement is identical to that shown in FIG. 1 and the components corresponding to those illustrated in FIG. 1 are designated by like reference numerals.

The thermally sensitive alternating current switch 60 forms a gate triggering current path for the triac 12 with the resistor 16. When the thermally sensitive thyristor 66 is broken over to be conducting due to a rise of its temperature, a voltage across the gate and second main termianls 12$g$ and 12$_{m2}$ of the triac 12 causes a alternating trigger current to flow through the triac 12 to conduct the latter in the opposite directions. This results in the supply of an alternating current power to the load 14.

It is noted that the turn-on of the thermally sensitive thyristor 66 due to a rise of its temperature occurs when a break-over voltage thereof is less than a voltage applied thereto by the source 10 of alternating current through the combined voltage-dividing and protective resistors 16 and 18. Therefore by applying a low voltage to the thermally sensitive thyristor 66, the latter can be triggered to its ON from its OFF state at a temperature approximating the switching temperature thereof.

A voltage applied across the thermally sensitive thyristor 66 is a direct current voltage provided by full-wave rectifying the alternating voltage from the source 10 by the rectifier bridge 61, 62, 63 and 64. If the thyristor 66 has a junction temperature less than a temperature required for breaking the same over at a time point when the voltage becomes null then it is turned off from its ON state.

The turning-off of the thermally sensitive thyristor 66 immediately leads to the turning-off of the triac 12 and therefore to the interruption of the power supply to the load 12.

Thus when externally heated, the thermally sensitive thyristor 66 is turned on at a predetermined temperature to cause an alternating current to be supplied to the gate electrode of the triac 12. This results in the turning-on of the triac 12. On the contrary, if the triac 12 reaches a temperature below the predetermined temperature then the same is turned off within one half cycle of the source voltage after that temperature has been reached.

It has been found that the thermally sensitive thyristors as above described in conjunction with the various Figures formed on a silicon substrate has a switching temperature continuously variable within a temperature range of from about 70° to 180°C by adjusting the associated variable resistor.

While the present invention has been illustrated and described in conjunction with several preferred embodiments thereof it is to be understood that various changes and modifications may be resorted to without departing from the spirit and scope of the present invention.

What is claimed is:

1. An electronic thermally sensitive switch device comprising a bidirectional triode thyristor including a gate electrode and a main electrode to control a load, at least one thermally sensitive thyristor connected between said gate and main electrodes of said bidirectional triode thyristor and means for operating said thermally sensitive thyristor in response to heat to control said load.

2. An electronic thermally sensitive switch device as claimed in claim 1 wherein said means for operating said thermally sensitive thyristor includes a gate trigger current path for said bidirectional triode thyristor and said thermally sensitive thyristor is operative in response to heat to close said gate triggering current path to permit an electric power to be supplied to said load through said bidirectional triode thyristor.

3. An electric thermally sensitive switch device as claimed in claim 1 wherein said thermally sensitive thyristor is operative in response to heat to bypass a gate triggering current for said bidirectional triode thyristor therethrough to turn the latter off.

4. An electronic thermally sensitive switch device as claimed in claim 1 wherein a pair of thermally sensitive thyristors are connected in anti-parallel circuit relationship between said gate and main electrodes of said bidirectional triode diode.

5. An electronic thermally sensitive switch device as claimed in claim 1 wherein said thermally sensitive thyristor is thermally coupled to said load.

6. An electronic thermally sensitive switch device comprising a bidirectional triode thyristor including a gate electrode and a main electrode to control a load, a full-wave rectifier bridge having a pair of alternating current inputs terminals connected to said gate and main electrodes of said bidirectional triode thyristor respectively, and a thermally sensitive thyristor connected across a pair of direct current output terminals of said full-wave rectifier bridge and operative in response to heat to control said load.

7. An electronic thermally sensitive switch device as claimed in claim 6 wherein said bidirectional triode thyristor includes a gate triggering current path and said thermally sensitive thyristor is operative in response to heat to close said gate triggering current path to permit an electric power to be supplied to said load through said bidirectional triode thyristor.

8. An electronic thermally sensitive switch device as claimed in claim 6 wherein said thermally sensitive thyristor is operative in response to heat to bypass a gate triggering current for said bidirectional triode thyristor therethrough to turn the latter off.

9. An electronic thermally sensitive switch device as claimed in claim 1 wherein said thermally sensitive thyristor is provided with a gate biasing circuit for controlling the switching temperature thereof.

10. An electronic thermally sensitive switch device as claimed in claim 9 wherein said gate biasing circuit includes a resistor connected across the gate and cathode electrodes of said thermally sensitive thyristor.

* * * * *